US010062721B2

(12) United States Patent
Wan et al.

(10) Patent No.: US 10,062,721 B2
(45) Date of Patent: Aug. 28, 2018

(54) ELEVATED PHOTODIODE WITH A STACKED SCHEME

(71) Applicant: Taiwan Semiconductor Manufacturing Company, Ltd., Hsin-Chu (TW)

(72) Inventors: Meng-Hsun Wan, Taipei (TW); Yi-Shin Chu, Hsin-Chu (TW); Szu-Ying Chen, Toufen Township (TW); Pao-Tung Chen, Tainan Hsien (TW); Jen-Cheng Liu, Hsin-Chu (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/378,906

(22) Filed: Dec. 14, 2016

(65) Prior Publication Data

US 2017/0092679 A1    Mar. 30, 2017

Related U.S. Application Data

(60) Continuation of application No. 14/841,252, filed on Aug. 31, 2015, now Pat. No. 9,530,811, which is a
(Continued)

(51) Int. Cl.
*H01L 31/062* (2012.01)
*H01L 31/113* (2006.01)
(Continued)

(52) U.S. Cl.
CPC .... *H01L 27/14632* (2013.01); *H01L 27/1463* (2013.01); *H01L 27/1464* (2013.01); *H01L 27/1469* (2013.01); *H01L 27/14621* (2013.01); *H01L 27/14627* (2013.01); *H01L 27/14634* (2013.01); *H01L 27/14636* (2013.01); *H01L 27/14645* (2013.01); *H01L 27/14685* (2013.01); *H01L 27/14687* (2013.01); *H01L 27/14689* (2013.01); *H01L 31/022466* (2013.01); *H01L 31/03762* (2013.01);
(Continued)

(58) Field of Classification Search
CPC ................. H01L 31/0232; H01L 31/18; H01L 27/14625; H01L 27/14627; H01L 27/14621; H01L 27/14632; H01L 31/02016; H01L 27/1469; H01L 27/14609
See application file for complete search history.

(56) References Cited

U.S. PATENT DOCUMENTS 7,906,825 B2    3/2011  Tweet et al.
8,466,010 B2 *  6/2013  Tai .................... H01L 27/14636
                                                          257/291
(Continued)

FOREIGN PATENT DOCUMENTS

JP     2010067827 A    3/2010
KR     100801447 B1    2/2008
KR  1020090077904 A    7/2009

*Primary Examiner* — Victor A Mandala
(74) *Attorney, Agent, or Firm* — Slater Matsil, LLP

(57) ABSTRACT

A device includes an image sensor chip having formed therein an elevated photodiode, and a device chip underlying and bonded to the image sensor chip. The device chip has a read out circuit electrically connected to the elevated photodiode.

20 Claims, 8 Drawing Sheets

Related U.S. Application Data continuation of application No. 14/531,820, filed on Nov. 3, 2014, now Pat. No. 9,123,617, which is a division of application No. 13/671,330, filed on Nov. 7, 2012, now Pat. No. 8,878,325.

(60) Provisional application No. 61/677,851, filed on Jul. 31, 2012.

(51) Int. Cl.
    *H01L 27/146*     (2006.01)
    *H01L 31/0352*     (2006.01)
    *H01L 31/18*     (2006.01)
    *H01L 31/0224*     (2006.01)
    *H01L 31/0376*     (2006.01)
    *H04N 5/378*     (2011.01)

(52) U.S. Cl.
    CPC ...... *H01L 31/035218* (2013.01); *H01L 31/18* (2013.01); *H04N 5/378* (2013.01)

(56) References Cited

U.S. PATENT DOCUMENTS

| | | | | |
|---|---|---|---|---|
| 8,629,524 B2* | 1/2014 | Wang | | H01L 27/14618 257/432 |
| 8,704,281 B2* | 4/2014 | Maehara | | B82Y 10/00 257/291 |
| 2009/0152605 A1* | 6/2009 | Ohno | | H01L 27/14603 257/294 |
| 2009/0224345 A1* | 9/2009 | Lee | | H01L 27/14632 257/432 |
| 2010/0060769 A1* | 3/2010 | Inuiya | | H01L 27/14623 348/311 |
| 2010/0248412 A1 | 9/2010 | Guidash | | |
| 2010/0258890 A1* | 10/2010 | Ahn | | H01L 27/14636 257/432 |
| 2010/0276776 A1* | 11/2010 | Lee | | H01L 27/14618 257/443 |
| 2011/0155893 A1* | 6/2011 | Endo | | H01L 27/14632 250/208.1 |
| 2011/0163223 A1* | 7/2011 | Guidash | | H01L 27/14634 250/208.1 |
| 2012/0104238 A1* | 5/2012 | Hirose | | G01J 1/46 250/214 R |
| 2012/0199882 A1 | 8/2012 | Shin | | |
| 2013/0020468 A1* | 1/2013 | Mitsuhashi | | H01L 27/14627 250/208.1 |
| 2013/0130426 A1* | 5/2013 | Toda | | G02B 5/188 438/69 |
| 2013/0248953 A1* | 9/2013 | Endo | | H01L 27/14632 257/291 |
| 2015/0155323 A1* | 6/2015 | Ahn | | H01L 27/14616 257/184 |

\* cited by examiner

ELEVATED PHOTODIODE WITH A STACKED SCHEME

This application is a continuation of U.S. patent application Ser. No. 14/841,252, filed Aug. 31, 2015, and entitled "Elevated Photodiode with A Stacked Scheme," which is a continuation of U.S. patent application Ser. No. 14/531,820, filed Nov. 3, 2014, and entitled "Elevated Photodiode with a Stacked Scheme," now U.S. Pat. No. 9,123,617, issued Sep. 1, 2015, which is a divisional of U.S. patent application Ser. No. 13/671,330, filed Nov. 7, 2012, and entitled "Elevated Photodiode with a Stacked Scheme," now U.S. Pat. No. 8,878,325, issued Nov. 4, 2014, which claims the benefit of the following provisionally filed U.S. Patent application: Application Ser. No. 61/677,851, filed Jul. 31, 2012, and entitled "Elevated Photodiode with Stacked Scheme," which applications are hereby incorporated herein by reference.

BACKGROUND

Image sensors, and in particular Back Side Illumination (BSI) image sensors are becoming increasingly popular and used in a variety of applications. As is the trend with integrated circuit technology, the trend is toward smaller and smaller features for image sensors, to allow for lower cost and greater packing density. When pixels pitch scale down to the sub micrometer range, the photodiode area is limited and thus it becomes difficult to maintain the performance such as Signal to Noise Ratio (SNR), Quantum Efficiency (QE), sensitivity, and the like.

Elevated photodiodes may overcome some shortcomings in conventional structures and methods for making such structures. Specific process tuning is needed, however, for so-called elevated photodiodes, and the same would be constrained by Application Specific Integrated Circuit (ASIC) process conditions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package including a first chip including elevated photodiodes stacked on a second chip and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Before addressing the illustrated embodiments specifically, aspects of various illustrated and contemplated embodiments are discussed generally. Embodiments of the present disclosure provide for a stacked device including a sensor wafer with an elevated photoelectrical conversion layer (sometimes referred to herein as a photoelectron conversion layer) and a device wafer, to form an elevated photodiode image sensor. In some embodiments, image sensor wafer 100 and device wafer 200 (FIG. 1) are stacked for face-to-face bonding. In other embodiments, image sensor wafer 100 and device wafer 200 (FIG. 2) are stacked for face-to-back bonding. In some embodiments, isolation structures are formed between pixels to improve cross-talk isolation performance. Various embodiments of the present disclosure may provide for a high fill factor of the resulting image sensor. Immunity to electrical crosstalk between adjacent pixels is an advantageous feature of some embodiments. Embodiments of the invention also provide for a flexible process tuning on each wafer.

Figure 1:
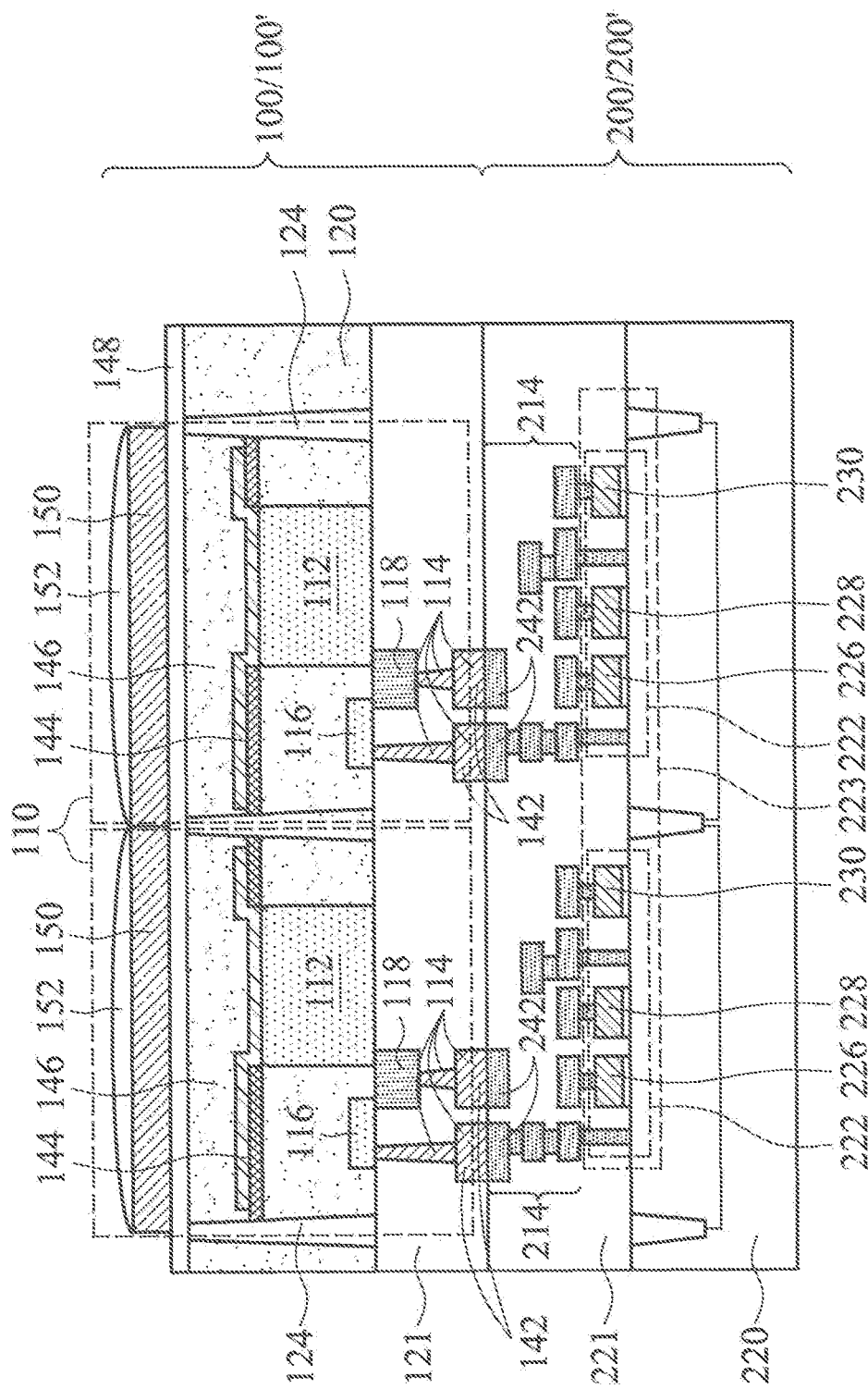
FIG. 1 is a schematic cross-sectional view of a first embodiment structure in accordance with some exemplary embodiments.

Turning now to the illustrated embodiments, FIG. 1 schematically illustrates in cross-section view an illustrative embodiment device in which image sensor wafer 100 and device wafer 200 are stacked in a face-to-face bonding arrangement. Two pixel units 110 are illustrated on image sensor wafer 100, although many more pixel units 110 are typically formed on image sensor wafer 100. One skilled in the art will recognize the components of image sensor wafer 100, including the illustrated pixel units 110, and such components are not described in detail herein for clarity. Likewise, the components of device wafer 200, whereby electrical signals from pixel units 110 can be received and processed are schematically illustrated herein, but are not described in detail, as those details are not necessary for an understanding of the present disclosure and/or will be apparent to those skilled in the art once informed by the present disclosure.

Figure 2:
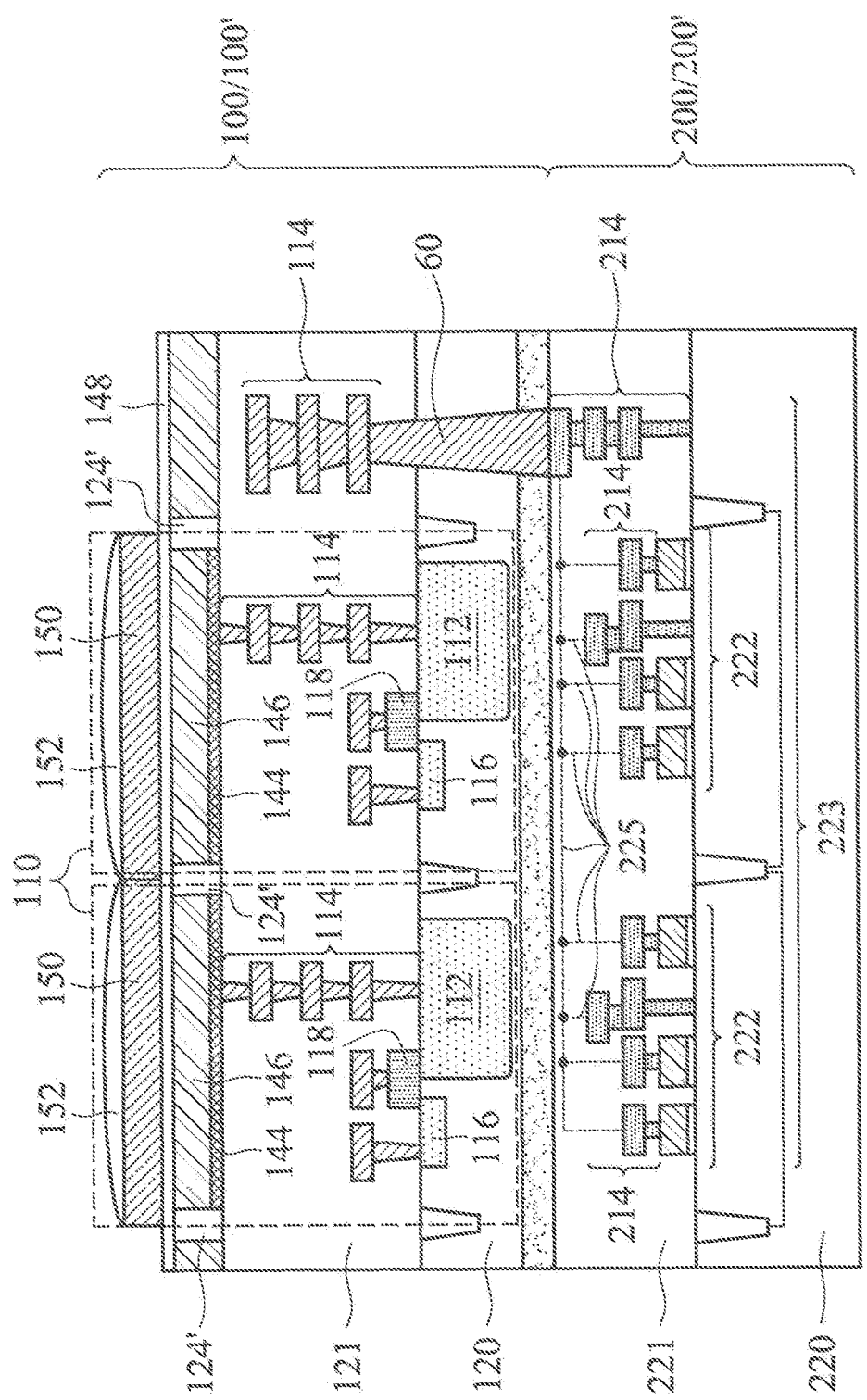
FIG. 2 is a schematic cross-sectional view of a first embodiment structure in accordance with some exemplary embodiments.

FIG. 2 illustrates a stacked image sensor wafer 100 and device wafer 200, wherein wafers 100 and 200 are configured in a face-to-back bonding configuration. Note the different configuration of image sensor wafer 100, particularly the location of the storage nodes 112 and interconnect structures 114, for the face-to-back bonding configuration.

Figure 3A:
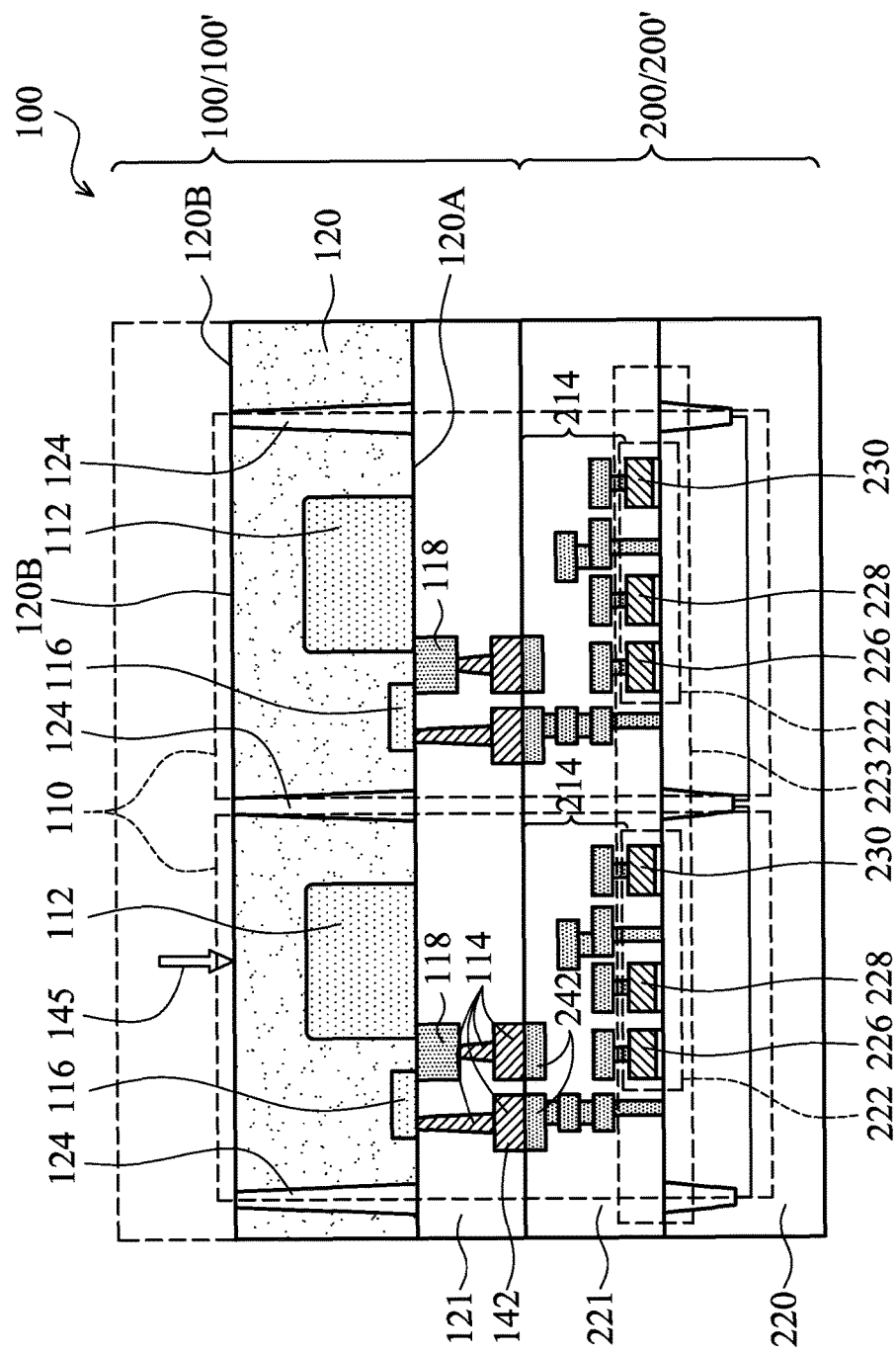
FIGS. 3a through 3c illustrate cross-sectional views of intermediate steps in the manufacturing of the illustrative embodiment device in FIG. 1 in accordance with some exemplary embodiments.
Figure 3B:
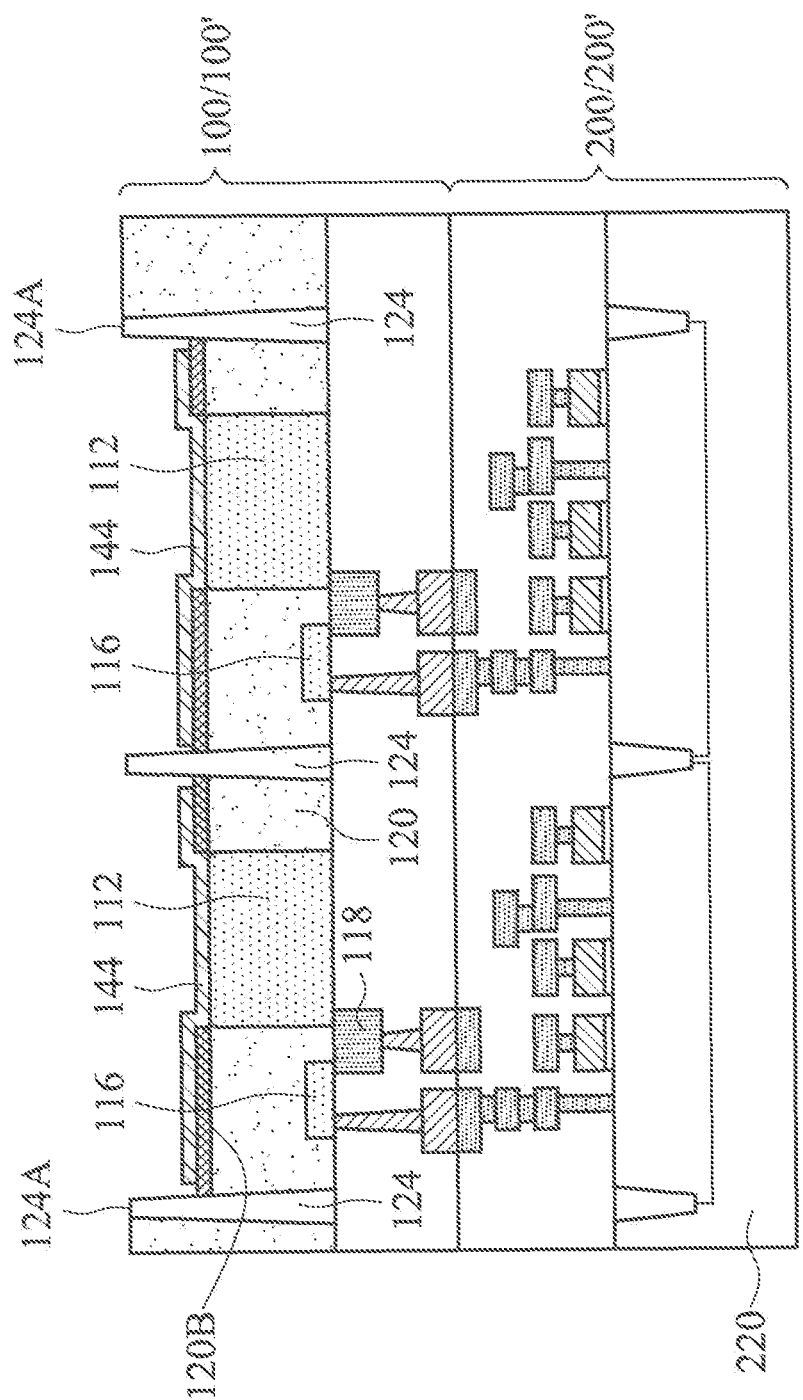
Figure 3C:
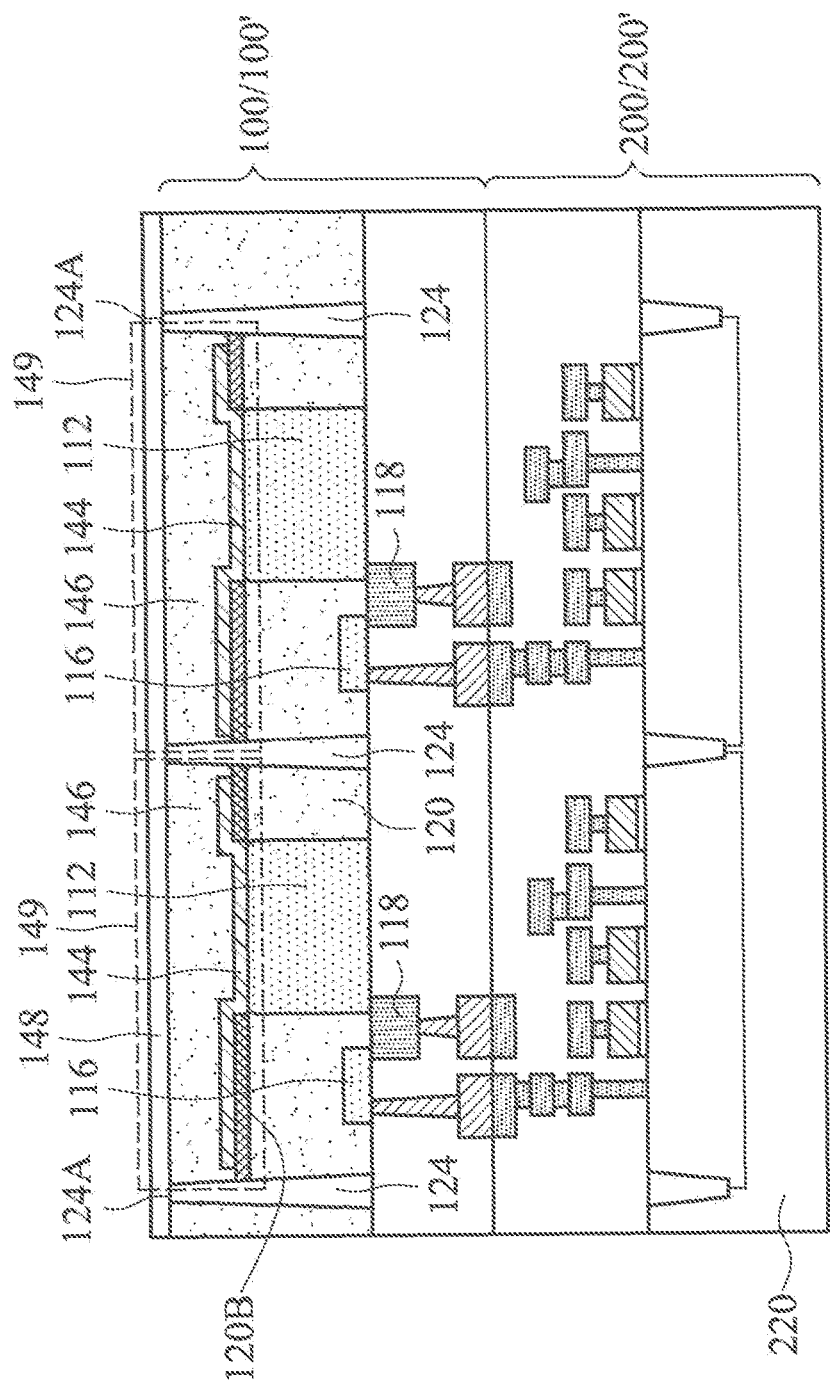

Intermediate steps in the manufacture of a package, such as the package illustrated in FIG. 1, are schematically illustrated in FIGS. 3a through 3c. FIG. 3a illustrates a structure in an intermediate stage of manufacture. At the stage illustrated in FIG. 3a, image sensor wafer 100, which includes a plurality of identical image sensor chips 100' therein, is formed. Storage nodes 112 and interconnect structures 114 have been formed on sensor wafer 100, and image sensor wafer 100 has been bonded in a face-to-face configuration to device wafer 200 (wherein appropriate active and passive devices and interconnects have been previously formed). Storage nodes 112 are formed of implanted regions. In some embodiments, storage nodes 112 are connected to transfer gate transistors 118, which are configured to electrically interconnect and disconnect storage nodes 112 and corresponding floating diffusion region 116 in the same pixel unit 110. In alternative embodiments, transfer gate transistors 118 are formed in device wafer 200 rather than in image sensor wafer 100. In the illustrated embodiments, interconnect structures 114 are illustrated as including one level of interconnection. It is appreciated that a plurality of layers of interconnect structures 114 may be formed in a plurality of dielectric layers 121, which may include low-k dielectric layers in some embodiments.

Image sensor wafer 100 also includes semiconductor substrate 120, which may be a silicon substrate, or may be formed of other semiconductor materials such as silicon germanium, silicon carbon, III-V compound semiconductor materials, or the like. Throughout the description, the side of substrate 120 including interconnect structures 114 is referred to as the front side of substrate 120 (which side is also referred to as the front side of image sensor wafer 100), and the opposite side is referred to as the back side. Accordingly, in FIG. 3a, the front side of image sensor wafer 100 faces down.

Two pixel units 110 are illustrated on image sensor wafer 100 for simplicity. Significantly more pixel units 110 are within the contemplated scope of this disclosure. Pixel units 110 are separated by isolation features 124, such as Deep Trench Isolation (DTI) structures, which are formed of, or comprise, a dielectric material such as an oxide (silicon oxide, for example) and/or a nitride (silicon nitride, for example). DTI structures 124 may extend from the back surface of substrate 120 into substrate 120. Furthermore, in some embodiments, DTI structures 124 may penetrate substrate 120, and extend from the front surface 120A (the surface facing down) to the back surface 120B of substrate 120. In the top view of the structure in FIG. 3a, DTI structures 124 may be interconnected to form a continuous grid, with pixel units 110 include portions in the grid openings, and portions outside and vertically aligned to the grid openings of the grid. Alternatively stated, DTI structures 124 include a plurality of rings, each encircling a portion of each of pixel units 110.

FIG. 3a also illustrates a cross-sectional view of device wafer 200, which comprises a plurality of identical device chips 200' therein. Device wafer 200 includes substrate 220, and logic circuit 223 formed at the front surface of substrate 220. Substrate 220 is a silicon substrate in some embodiments. Alternatively, substrate 220 is formed of other semiconductor materials such as silicon germanium, silicon carbon, III-V compound semiconductor materials, or the like. In accordance with some exemplary embodiments, logic circuit 223 includes read out circuits 222. Each of read out circuits 222 may include a plurality of transistors, such as row selector 226, source follower 228, and reset transistor 230. Row selectors 226, source followers 228, and reset transistors 230 may form portions of pixel units 110, with each of pixel units 110 including one of row selectors 226, one of source followers 228, and one of reset transistors 230. Accordingly, each of pixel units 110 may extend into device wafer 200 to include one of read out circuits 222.

Logic circuit 222 may also include one or more of Image Signal Processing (ISP) circuits such as Analog-to-Digital Converters (ADCs), Correlated Double Sampling (CDS) circuits, row decoders, and the like, which may also be considered as parts of the read out circuits. Interconnect structure 214 is formed over, and electrically coupled to, logic circuit 223. Interconnect structure 214 includes a plurality of metal layers in a plurality of dielectric layers 221, with metal lines and vias disposed in dielectric layers 221. In some exemplary embodiments, dielectric layers 221 include low-k dielectric layers. The low-k dielectric layers may have low k values lower than about 3.0. Dielectric layers 221 may further include a passivation layer formed of non-low-k dielectric materials having k values greater than 3.9. In some embodiments, the passivation layer includes a silicon oxide layer, a silicon nitride layer, an Un-doped Silicate Glass (USG) layer, and/or the like.

Metal pads 142 and 242 are formed at the surfaces of wafers 100 and 200, respectively, wherein metal pads 142 and 242 may have their top surfaces substantially level with the top surfaces of the top ones of dielectric layers 121 and 221, respectively. Metal pads 142 and 242 may also comprise copper, aluminum, and possibly other metals. Metal pads 142 are bonded to the respective metal pads 242, so that the devices in wafers 100 and 200 are electrically coupled to each other. In some embodiments, as a result of the bonding, each of the pixel units 110 includes a portion in wafer 100 and a portion in wafer 200, which are electrically connected to each other to form an integrated functional pixel unit that may generate electrical signals in response to photon stimulation, and store and output the electrical signals in response to the commands for reading and resetting the electrical signals.

As shown in FIG. 3a, the backside of image sensor wafer 100 is thinned down (symbolized by arrow 145) after the bonding of wafers 100 and 200. The resulting semiconductor substrate 120 may have a thickness smaller than about 10 µm, or smaller than about 5 µm. Image sensor wafer 100 can be thinned down, e.g., by mechanical grinding/polishing, through chemical mechanical polishing, through etching, or the like. The thickness is an artifact of the technology node and the desired device properties, and can be adjusted through routine experimentation.

As shown in FIG. 3b, portions of the backside of substrate 120 are further thinned down to expose respective storage nodes 112 in the respective pixel units 110. The thinning down may be performed by selectively etching substrate 120, and DTI structures 124 are not etched. As a result, back surface 120B of substrate 120 is lower than the top ends 124A of DTI structures 124. Pixel electrodes 144 are formed in electrical communication with respective storage nodes 112. In some embodiments, pixel electrodes 144 are also referred to as bottom electrodes 144.

While other conductive materials are within the contemplated scope of the present disclosure, examples of available materials for bottom electrodes 144 include Al, TiN, Cr, and the like. Bottom electrodes 144 can be deposited using techniques such as Chemical Vapor Deposition (CVD), Physical Vapor Deposition (PVD), Plasma Enhanced Chemical Vapor Deposition (PECVD), Metal Organic Chemical Vapor Deposition (MOCVD), sputtering, and the like. In the illustrated embodiments, bottom electrodes 144 are formed to a thickness of between about 0.3 µm and about 0.8 µm. Bottom electrodes 144 may be in contact with the respective underlying storage nodes 112 to establish the electrical connection.

Photoelectrical conversion layers 146 are formed over and in electrical communication with (and may be in contact with) bottom electrodes 144, as shown in FIG. 3c. Transparent top electrode 148 is formed over and in electrical communication with photoelectrical conversion layers 146. By way of example, and not by way of limitation, photoelectrical conversion layers 146 could comprise amorphous silicon, a quantum dot layer, an organic material, or the like. Likewise, top electrode 148 could comprise Indium Tin Oxide (ITO), although one skilled in the art will recognize suitable alternatives through routine experimentation once informed by the present disclosure. Photoelectrical conversion layers 146 may be separated from each other by DTI structures 124. Top electrode 148 may be a continuous layer having its bottom surface contacting the top surfaces of photoelectrical conversion layers 146 and DTI structure 124. Each of Bottom electrodes 144, photoelectrical conversion layers 146 and the respective overlying portion of top electrode 148 forms an elevated photodiode 149, which is different from conventional photodiodes that are built in semiconductor substrates.

Referring back to FIG. 1, in accordance with some exemplary embodiments, additional components such as color filters 150, micro-lenses 152, and the like, are further formed on the backside of image sensor wafer 100. The resulting stacked wafers 100 and 200 are then sawed apart into packages, wherein each of the packages includes one chip 100' from image sensor wafer 100 and one chip 200' from device wafer 200.

Figure 4A:
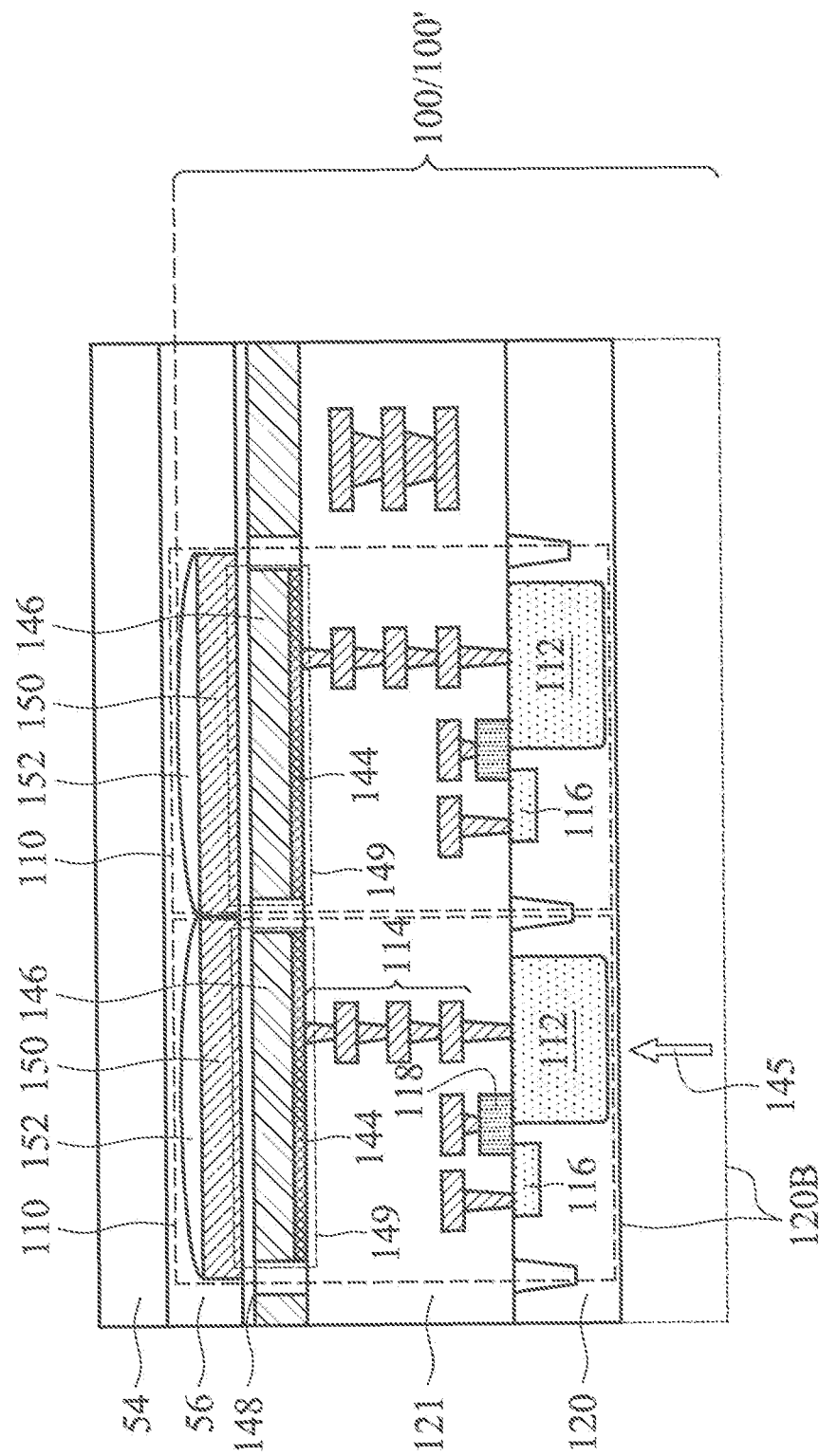
FIGS. 4a through 4c illustrate cross-sectional views of intermediate steps in the manufacturing of the illustrative embodiment device in FIG. 2 in accordance with some exemplary embodiments.
Figure 4B:
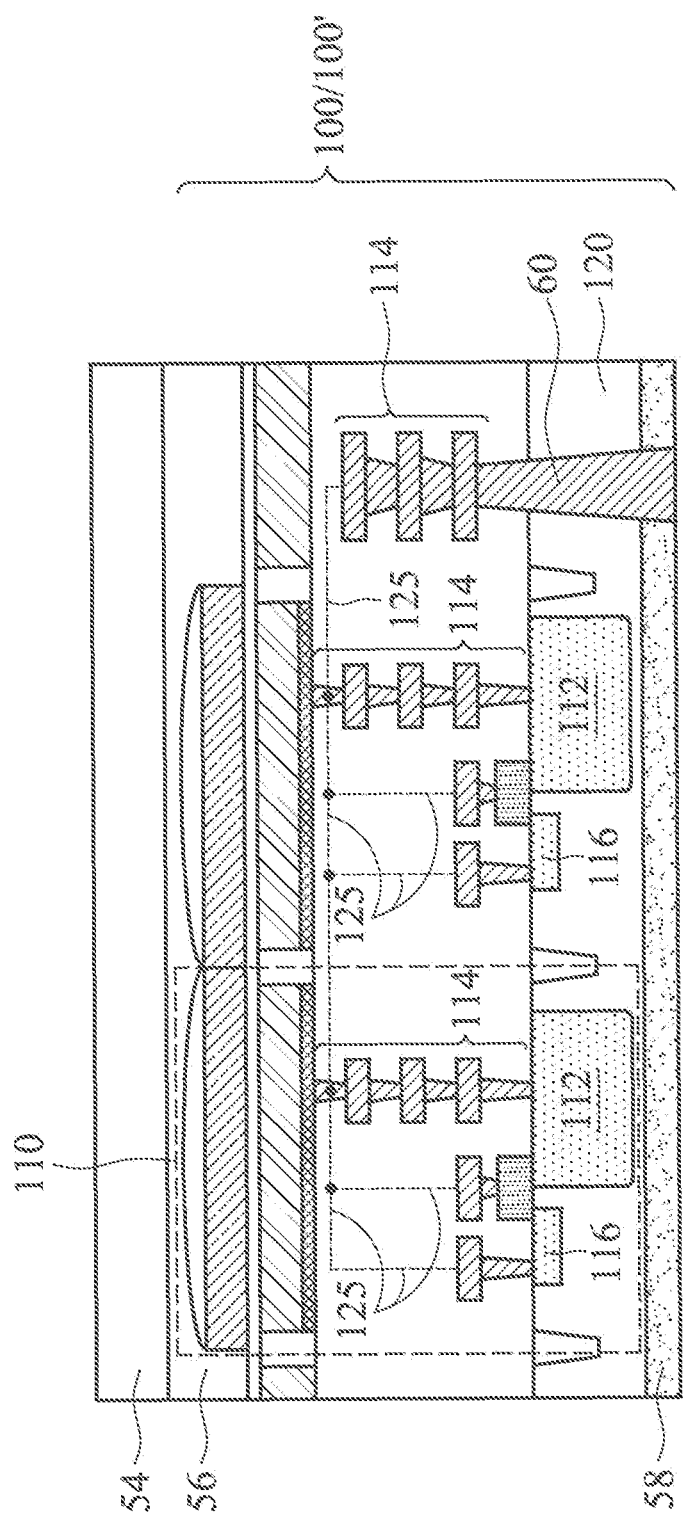
Figure 4C:
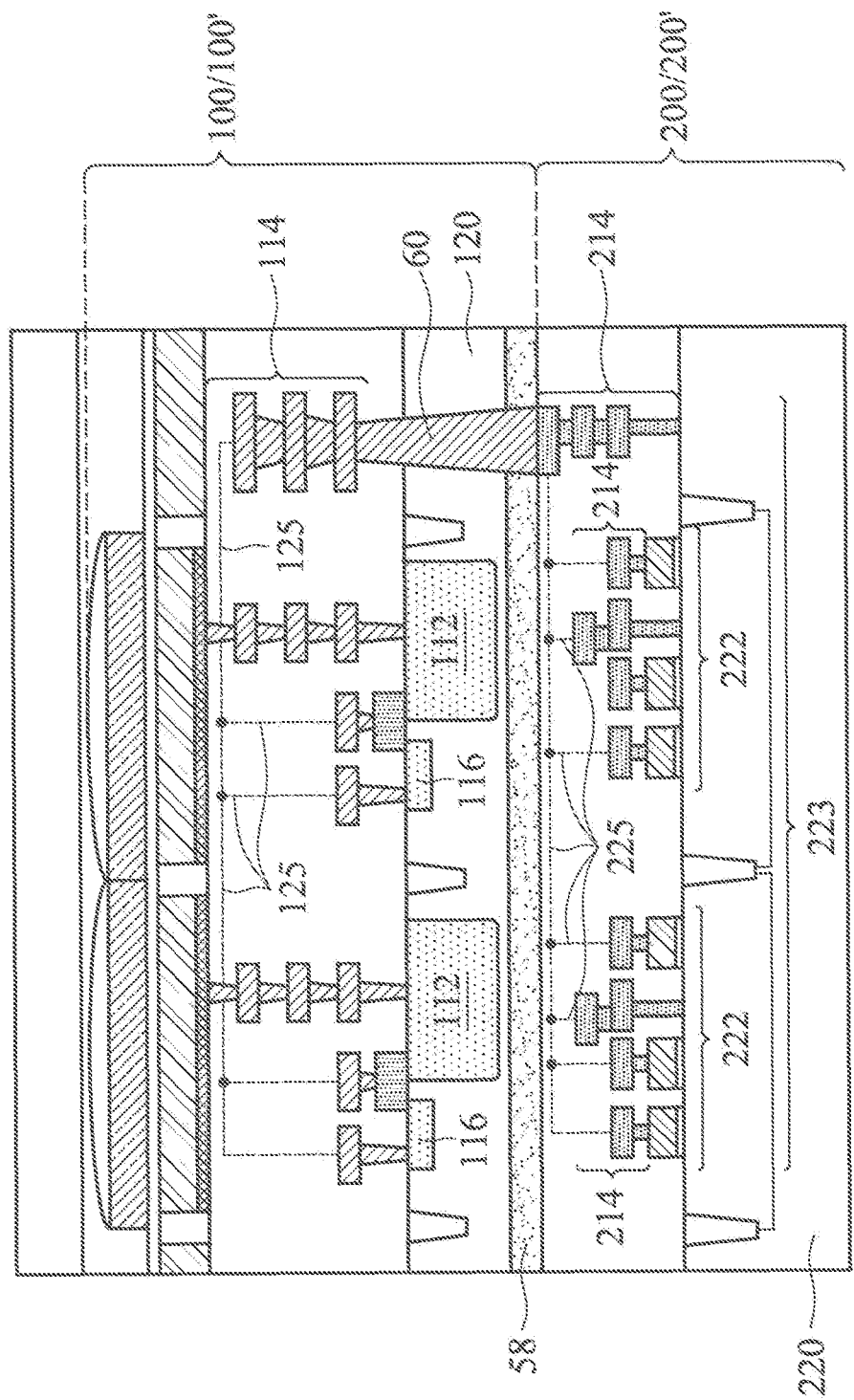

FIGS. 4a through 4c illustrate intermediate steps in the manufacture of a package, such as a face-to-back structure illustrated in FIG. 2. Unless specified otherwise, the materials and formation methods of the components in these embodiments are essentially the same as the like components, which are denoted by like reference numerals in the embodiments shown in FIGS. 1 and 3a through 3c. The details regarding the formation process, the materials, and the specification, of the components shown in FIGS. 2 and 4a through 4c may thus be found in the discussion of the embodiment shown in FIGS. 1 and 3a through 3c.

As discussed above, image sensor wafer 100 that is used for a face-to-back configuration differs from image sensor wafer 100 suitable for a face-to-face configuration. For example, as shown in FIG. 4a, photodiodes 149 (including the transparent top electrode 148, photoelectrical conversion layers 146, and bottom electrodes 144) are formed over both substrate 120 and interconnect structure 114. Storage nodes 112 and respective photodiodes 149 are electrically connected to each other through one or more intervening conductive interconnect structure 114, as shown. Isolation structures 124' in these embodiments may have top surfaces level with the top surfaces of photoelectrical conversion layers 146, and bottom surfaces level with the bottom surfaces of bottom electrodes 144.

Image sensor wafer 100 is substantially complete in the stage of manufacture illustrated in FIG. 4a with color filter 150 and/or micro-lens 152 having been formed adjacent to photodiodes 149. Image sensor wafer 100 is shown mounted to carrier 54, such as a glass substrate. This may be accomplished using adhesive layer 56 to adhere carrier 54 to image sensor wafer 100. Quartz, silicon, or other materials could be used in lieu of glass. After mounting image sensor wafer 100 to carrier 54, the backside of image sensor wafer 100 is thinned (symbolized by arrow 145), for example, using a process similar to those described regarding FIG. 3a.

Note in these embodiments, it is not necessary to expose storage nodes 112 in the wafer thinning process. This is partially because the electrical contact to the storage nodes 112 is made from the top of the storage node, i.e., the surface away from the backside surface of wafer 100. After image sensor wafer 100 is thinned to a desired thickness, oxide layer 58 is formed on the backside, as shown in FIG. 4b. In some embodiments, oxide layer 58 comprises silicon oxide, and may be formed using a deposition method such as PECVD. Vias 60, sometimes referred to as through-vias 60, and sometimes referred to as through-substrate vias or through-silicon vias (TSVs) are also formed extending from the surface of the backside of image sensor wafer 100 up to the interconnect structure 114. Various electrical connections can be made in this manner. Although one via 60 is shown in FIG. 4b, multiple vias and hence multiple electrical connections can be formed. Furthermore, each of pixel units 110 may include one or more via. Dashed lines 125 are drawn to represent the likely electrical connections between vias 60 and the devices in wafer 100.

FIG. 4c illustrates the process of bonding the back side of image sensor wafer 100 to the front side of a device wafer. Dashed lines 225 are also drawn to represent the electrical connections between vias 60 and logic circuits 223. Device wafer 200 may be essentially the same as illustrated in FIG. 3a, for instance. In the embodiments of FIG. 4c, however, it is desirable that device wafer 200 has an appropriate bonding surface on its front side (the side with interconnect structure 214) to ensure adequate adhesion and bonding to image sensor wafer 100. This surface could be a treated oxide surface, a highly polished silicon surface, or any other surface that provides for sufficient bonding with the oxide layer on the "back" side of image sensor wafer 100. Care should be taken to properly align image sensor wafer 100 and device wafer 200 in the bonding process to ensure that contacts formed on the respective wafers 100 and 200 align with one another to form good electrical contact between the devices on the respective wafers 100 and 200. Carrier 54 and adhesive layer 56 can then be removed, and a singulation is performed to saw the bonded wafers 100 and 200 into a plurality of packages, each including one chip 100' from wafer 100, and one chip 200' from wafer 200, resulting in the structure illustrated in FIG. 2 in accordance with exemplary embodiments.

The illustrated embodiments provide the advantageous feature that the processes of the image sensor wafers can be optimized for forming the pixel elements. Furthermore, processes can be optimized for forming the supporting circuitry such as the read out circuits in the device wafers. This is advantageous since the image sensor wafers and the device wafers have different process requirements. Accordingly, by separating the manufacturing processes, the manufacturing processes of the image sensor wafers and the device wafers do not affect each other. Furthermore, by forming elevated photodiodes, the fill factors of the photodiodes may be maximized since it is not affected by the metal routing or any transistor in the respective wafer.

In accordance with some embodiments, a device includes an image sensor chip having formed therein an elevated photodiode; and a device chip underlying and bonded to the image sensor chip, the device chip having a read out circuit electrically connected to the elevated photodiode.

In accordance with other embodiments, a device includes an image sensor chip and a device chip. The image sensor chip includes a first semiconductor substrate, an elevated photodiode overlying the first semiconductor substrate, and a first interconnect structure electrically coupled to the elevated photodiode. The device chip is underlying and bonded to the image sensor chip. The device chip includes a second semiconductor substrate, and a read out circuit at a top surface of the second semiconductor substrate. The read out circuit is electrically coupled to the elevated photodiode. The device chip further includes a second interconnect structure overlying the first semiconductor substrate.

In accordance with yet other embodiments, a method includes forming an elevated photodiode over a semiconductor substrate of an image sensor wafer, and bonding together the image sensor wafer and a device wafer, wherein the device wafer includes a read out circuit electrically coupled to the elevated photodiode.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of manufacturing a device, the method comprising:
    forming a recess within a semiconductor substrate;
    depositing a first electrode within the recess;
    depositing a photoelectrical conversion layer within the recess; and
    depositing a second electrode over the photoelectrical conversion layer, the second electrode being transparent and extending out of the recess.

2. The method of claim 1, wherein the forming the recess forms the recess with dielectric sidewalls.

3. The method of claim 2, wherein the dielectric sidewalls surround the recess.

4. The method of claim 1, further comprising bonding the semiconductor substrate to a semiconductor wafer.

5. The method of claim 4, wherein the semiconductor wafer comprises a read out circuit.

6. The method of claim 1, further comprising forming a through via extending from a first side of the semiconductor substrate to a second side of the semiconductor substrate opposite the first side.

7. A method of manufacturing a device, the method comprising:
    manufacturing an elevated photodiode adjacent to a first side of a first semiconductor substrate, wherein the manufacturing the elevated photodiode comprises forming a recess within the first semiconductor substrate;
    manufacturing a metallization layer adjacent to a second side of the first semiconductor substrate;
    manufacturing first external connections in electrical connection with the metallization layer; and
    bonding the first external connections with second external connections, the second external connections being in electrical connection with a second semiconductor substrate.

8. The method of claim 7, wherein the manufacturing the elevated photodiode further comprises:
    depositing a first electrode within the recess;
    depositing a photoelectric conversion layer within the recess and over the first electrode; and
    depositing a second electrode in electrical connection with the photoelectric conversion layer.

9. The method of claim 8, wherein the depositing the second electrode deposits the second electrode outside of the recess.

10. The method of claim 8, wherein the forming the recess comprises at least in part a etching process.

11. The method of claim 7, further comprising sawing the second semiconductor substrate after the bonding the first external connections with the second external connections.

12. The method of claim 7, wherein the second semiconductor substrate comprises a read out circuit.

13. The method of claim 12, wherein the read out circuit further comprises a correlated double sampling circuit.

14. A method of manufacturing a semiconductor device, the method comprising:
    providing a first semiconductor die;
    providing a second semiconductor die;
    bonding the first semiconductor die to the second semiconductor die such that a pixel unit extends between the first semiconductor die and the second semiconductor die, the pixel unit comprising:
        an elevated photodiode; and
        read out circuitry.

15. The method of claim 14, wherein the pixel unit comprises a transfer transistor located on the first semiconductor die and wherein the elevated photodiode is located on the first semiconductor die.

16. The method of claim 14, further comprising a deep trench isolation structure located within the first semiconductor die, wherein the deep trench isolation structure comprises a plurality of rings, at least one of the plurality of rings encircling the pixel unit.

17. The method of claim 14, wherein the bonding the first semiconductor die to the second semiconductor die further comprises bonding a first wafer to a second wafer.

18. The method of claim 14, wherein the read out circuitry comprises an image signal processing circuit.

19. The method of claim 14, wherein the pixel unit further comprises a dielectric material, the dielectric material having a first surface level with a surface of a photoelectrical conversion layer and a second surface level with a first electrode, wherein the photoelectrical conversion layer and the first electrode are portions of the elevated photodiode.

20. The method of claim 19, wherein the elevated photodiode further comprises a second electrode, the second electrode in physical contact with a surface of the dielectric material.

* * * * *